US 8,206,006 B2

(12) United States Patent
Huber et al.

(10) Patent No.: US 8,206,006 B2
(45) Date of Patent: Jun. 26, 2012

(54) ILLUMINATION DEVICE AND PROJECTION DEVICE WITH SUCH AN ILLUMINATION DEVICE

(75) Inventors: Andreas Huber, Maisach (DE); Ralf Hying, Munich (DE); Peter Niedermeier, Munich (DE)

(73) Assignee: Osram AG, Munich (DE)

( * ) Notice: Subject to any disclaimer, the term of this patent is extended or adjusted under 35 U.S.C. 154(b) by 192 days.

(21) Appl. No.: 12/601,020

(22) PCT Filed: May 22, 2007

(86) PCT No.: PCT/EP2007/054963
§ 371 (c)(1),
(2), (4) Date: Nov. 20, 2009

(87) PCT Pub. No.: WO2008/141674
PCT Pub. Date: Nov. 27, 2008

(65) Prior Publication Data
US 2010/0149808 A1 Jun. 17, 2010

(51) Int. Cl.
*F21V 21/00* (2006.01)
(52) U.S. Cl. .......... 362/249.04; 362/249.01; 362/249.02
(58) Field of Classification Search ............. 362/249.04, 362/249.02, 249.08
See application file for complete search history.

(56) References Cited

U.S. PATENT DOCUMENTS

| 7,213,929 B2 * | 5/2007 | Imade ............. 353/102 |
| 2002/0187803 A1 | 12/2002 | Nakamura et al. |
| 2005/0122656 A1 * | 6/2005 | Lee ............. 361/118 |
| 2009/0207630 A1 * | 8/2009 | Satoh et al. ............. 362/615 |

FOREIGN PATENT DOCUMENTS

| DE | 20319650 | * | 5/2004 |
| DE | 20319650 U1 | | 5/2004 |
| EP | 1691583 A2 | | 8/2006 |
| EP | 1768470 A1 | | 3/2007 |
| JP | 2004199024 A | | 7/2004 |
| JP | 2006243310 A | | 9/2006 |
| JP | 2006344472 A | | 12/2006 |

OTHER PUBLICATIONS

English abstract of DE 203 19 650 U1.
International Search Report of PCT/EP2007/054963 mailed on Feb. 21, 2008.
English language abstract for JP 2006243310A, Sep. 14, 2006.

* cited by examiner

*Primary Examiner* — Ali Alavi

(57) ABSTRACT

An illumination device may include a flexible printed circuit board; a power electronics module; and a light-emitting diode module, which is electrically connected to the power electronics module by means of the flexible printed circuit board.

19 Claims, 2 Drawing Sheets

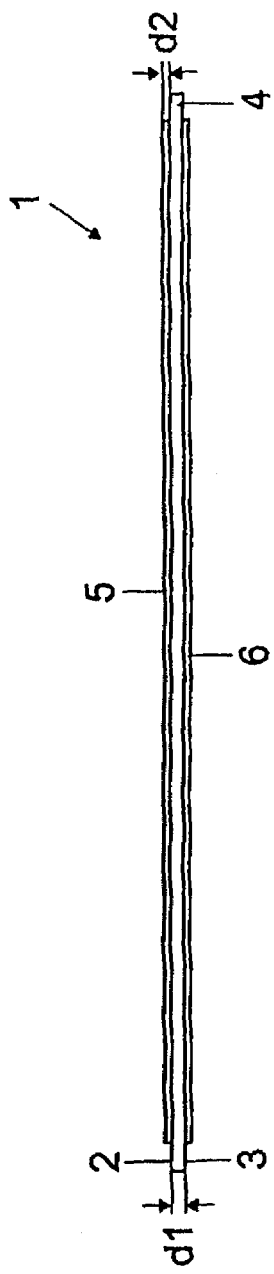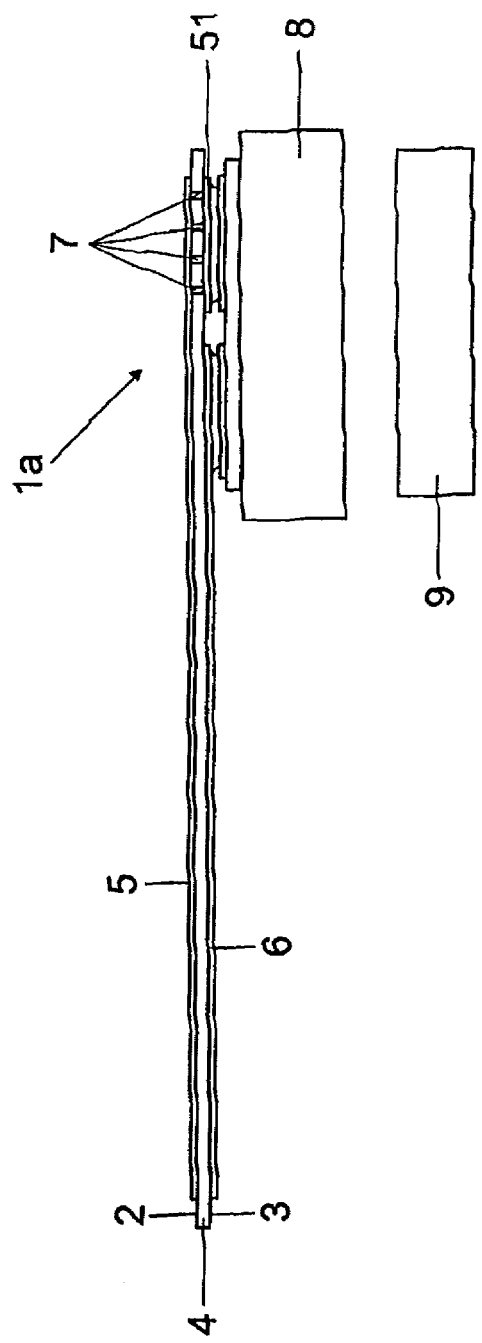

ILLUMINATION DEVICE AND PROJECTION DEVICE WITH SUCH AN ILLUMINATION DEVICE

RELATED APPLICATIONS

The present application is a national stage entry according to 35 U.S.C. §371 of PCT application No. PCT/EP2007/054963 filed on May 22, 2007.

TECHNICAL FIELD

The invention relates to an illumination device and a projection device with such an illumination device.

BACKGROUND

High-intensity light-emitting diodes for operation in the ampere range have only been known recently. Said light-emitting diodes require corresponding driving via power electronics. The electrical connection between power electronics and a high-intensity light-emitting diode is implemented in known systems by twisted lines. However, this only represents a suboptimal solution as regards high operational functionality and operational reliability.

Summary

Various embodiments provide an illumination device with which high operational reliability of a light-emitting diode module is made possible and with which this can be achieved with as little complexity and as inexpensively as possible.

An illumination device according to the invention includes a power electronics module and at least one light-emitting diode module. The power electronics module is electrically connected to the light-emitting diode module by means of a flexible printed circuit board. Such an embodiment of a connecting line in the form of a flexible printed circuit board allows for an extremely high degree of operational reliability. Furthermore, the driving of high-intensity light-emitting diodes can be achieved with extremely rapid drive signals in the frequency range above 100 kHz thereby.

Preferably, the light-emitting diode module is designed for operation with electrical currents in the ampere range. Provision is in particular made for the light-emitting diode module to have at least one light-emitting diode chip with a plurality of light-emitting diodes, and a light-emitting diode chip to be designed for operation with electrical currents of greater than or equal to 1 A, in particular up to 6 A. Preferably, a light-emitting diode chip has a surface area of approximately 1 mm$^2$ or else more.

In particular, provision can be made for a light-emitting diode module to include at least two light-emitting diode chips. This results in operating currents in the two-digit ampere range. By using the flexible printed circuit board as the connecting line, it is possible to produce a low-resistance and low-inductance connection between the power electronics module and the high-intensity light-emitting diodes which has a simple design even at such electrical currents.

As a result, completely different frequency ranges and also electrical currents are provided, for example, in comparison with high-frequency technology.

Preferably, conductor tracks for signal transmission between the power electronics module and the light-emitting diode module and therefore for transmitting the electrical currents are formed on the upper side and the lower side of the flexible printed circuit board. Preferably, the conductor tracks are thus provided on opposite sides of the carrier material or the carrier plate of the flexible printed circuit board.

Preferably, the carrier material of the flexible printed circuit board has a thickness of greater than 30 μm, in particular 50 μm.

The carrier material of the flexible printed circuit board can include polyimide or be FR4. However, provision can also be made for the carrier material of the flexible printed circuit board to be a simple insulating tape with a corresponding thickness. Then, copper tracks or copper plates can preferably be formed as conductor tracks on this insulating tape on opposite sides and therefore on the lower side and the upper side.

Even in the case of the carrier material being formed from polyimide, copper plates can be arranged as conductor tracks on the upper side and the lower side.

In particular in the event of the conductor tracks being applied to the upper side and the lower side of the carrier material of the flexible printed circuit board, provision is made for the flexible printed circuit board to be designed in such a way that it is designed for transmission of signals with rise and fall times of less than or equal to 15 μs, in particular less than or equal to 10 μs.

In particular, rapid driving operations of the light-emitting diode module with periods of below 3 μs can thus be realized.

Preferably, the conductor tracks of the flexible printed circuit board are covered with a solder resist or insulating tape.

Provision can be made for the light-emitting diode module to be releasably connected to the flexible printed circuit board. A releasable connection is understood to mean the possibility of connection and separation in a destruction-free and reversible manner. In particular, provision can be made for plugs, in particular flat plugs, to be arranged on the flexible printed circuit board, by means of which plugs a releasable plug-type connection with the light-emitting diode module is formed. Flat plugs with 6.3 mm, for example, can be used as the connecting plugs.

Provision can be made for the plugs, in particular the flat plugs, to be designed to have additional actuation of a latching tab, as a result of which the light-emitting diode module can then be connected virtually without any force.

As a result, the wear or the damage of components of the illumination device can be prevented.

In particular provision is made for the plugs of the flexible printed circuit board to be arranged on one side of the flexible printed circuit board, and for it to be possible for electrical contact to be made between the conductor track, which is formed on the opposite side of the flexible printed circuit board, and the associated plug by at least one throughplating through the carrier material.

The light-emitting diode module can also be permanently connected to the flexible printed circuit board. Such an unreleasable connection can be realized, for example, by soldering of the light-emitting diode module to the flexible printed circuit board.

As a result, a permanent electrical and mechanical connection can be provided, with which undesirable release can be prevented.

The flexible printed circuit board can preferably be plugged into a slot in the circuit board of the power electronics module.

In particular, provision is made for the flexible printed circuit board to then additionally be soldered in the plugged-in state into the circuit board of the power electronics module. As a result, it can be prevented from falling out or sliding in an undesirable manner, and therefore the electrical contact can be prevented from being impaired.

The advantage of the design of the illumination device with the flexible printed circuit board can be seen in particular, inter alia, in the low inductance, i.e. also in the possibility of the low resistance. Furthermore, such a connection variant can be produced in a simple manner and can thus be implemented inexpensively.

Plugs on the flexible printed circuit board can be soldered, as heavy-duty plugs both using PIH and SMD technology, directly on the copper material of a conductor track. The thickness of the conductor tracks can have values in particular of 35 µm, 70 µm or 105 µm.

A further aspect of the invention relates to a projection device with a display unit and an illumination device according to the invention or an advantageous configuration thereof. The illumination device is arranged such that it is positioned so as to illuminate the display unit. In particular, a projection device can thus be realized with high-intensity light-emitting diodes. A projection device can be in the form of a rear projection television set (RPTV), for example. Other projectors can also be equipped with an illumination device according to the invention.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a sectional illustration through a flexible printed circuit board of an illumination device according to the invention;

FIG. 2 shows a sectional illustration through a flexible printed circuit board and a light-emitting diode module of an illumination device according to the invention;

DETAILED DESCRIPTION

Figure 3:
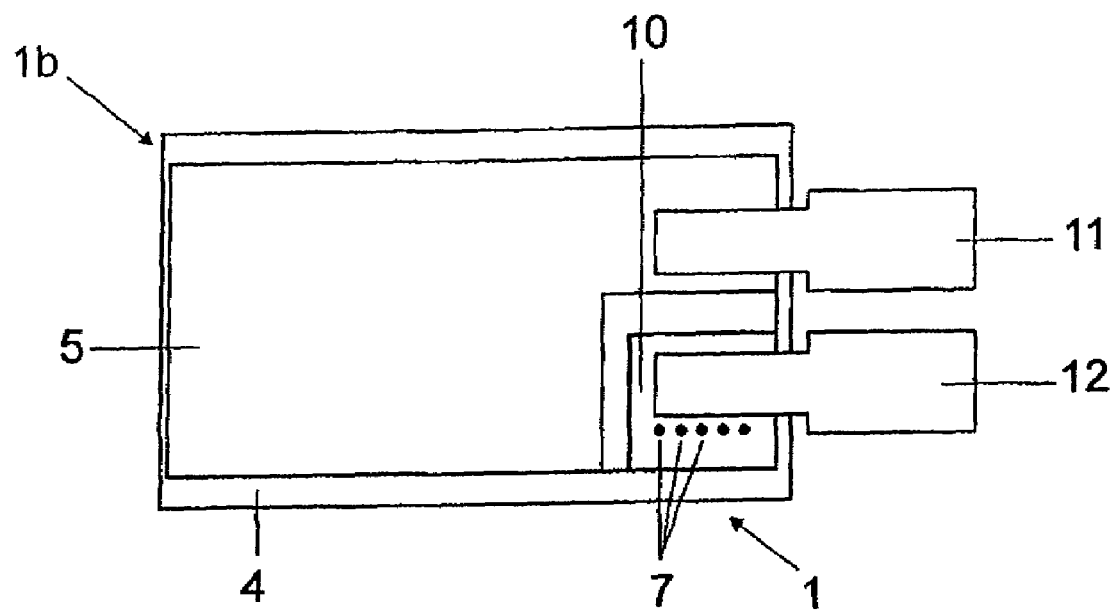
FIG. 3 shows a plan view of a further embodiment of a flexible printed circuit board of an illumination device according to the invention.

The following detailed description refers to the accompanying drawings that show, by way of illustration, specific details and embodiments in which the invention may be practiced.

FIG. 1 shows a schematic sectional illustration of a flexible printed circuit board 1, which has an electrically insulating carrier material 4, which is in the form of a plate. A first conductor track 5 is formed on an upper side 2 of the carrier material 4, and a second conductor track 6 is formed on a lower side 3 of the carrier material 4. The conductor tracks 5 and 6 are preferably in the form of copper plates.

The carrier material 4 can be polyimide. Provision can likewise be made for the carrier material 4 to be a simple, conventional insulating tape. The conductor tracks 5 and 6 can each be covered with a solder resist or insulating tape. The thickness d1 of the carrier material 4 is approximately 50 µm in this exemplary embodiment. The thickness d2 of a conductor track 5 can be 35 µm, for example. Provision can likewise be made for the thickness d2 to be 70 µm or 105 µm, for example.

Figure 4:
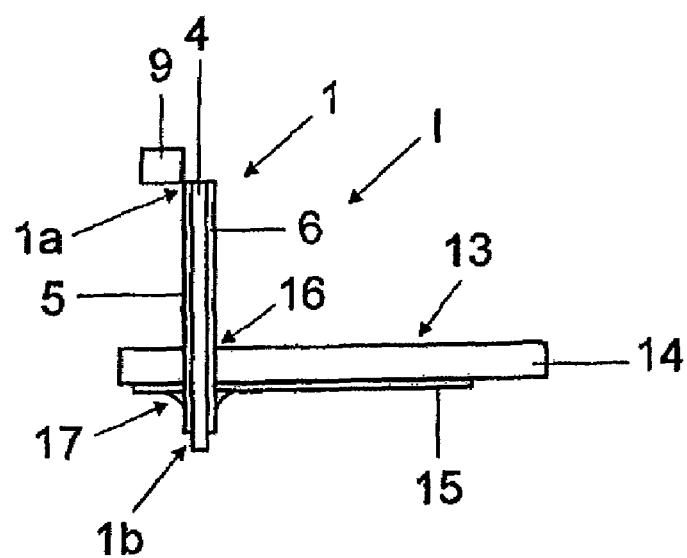
FIG. 4 shows a schematic sectional illustration of an exemplary embodiment of an illumination device according to the invention.

FIG. 2 shows a schematic sectional illustration of a further embodiment of subcomponents of an illumination device I according to the invention (FIG. 4). Throughplatings 7 through the carrier material 4 are formed at a first end 1a of the flexible printed circuit board 1, by virtue of which throughplatings an electrical connection between the first conductor track 5 on the upper side 2 and a conductor track element 51 on the lower side 3 is implemented. The conductor track element 51 is associated with the first conductor track 5 and is formed in contactless fashion with the second conductor track 6 on the lower side 3. Electrical contact is made between a block-like copper element 8 on the side facing the lower side and the second conductor track 6 and the conductor track element 51 of the first conductor track 5. A light-emitting diode module 9 can be permanently connected to this copper element 8 by virtue of it being soldered to the copper element 8, for example. FIG. 2 shows the separated state and therefore the unfixed state of the light-emitting diode module 9 on the copper element 8.

FIG. 3 shows a plan view of a further embodiment of a flexible printed circuit board 1. This plan view illustrates the plate-shaped design of the first conductor track 5. Furthermore, said figure also shows a conductor track element 10, which corresponds to the conductor track element 51, with electrical contact being made by means of throughplatings 7' between said conductor track element 10 and the second conductor track 6 arranged on the lower side 3. In each case a flat plug 11 and 12 is electrically connected both to the first conductor track 5 and the second conductor track 6 via the conductor track element 10. The flat plug 11 is soldered to the first conductor track 5. Furthermore, the second flat plug 12 is soldered to the conductor track element 10. Both flat plugs 11 and 12 are in the form of flat plugs with 6.3 mm.

Furthermore, both flat plugs 11 and 12 are positioned permanently on one side, in particular on the upper side 2, of the carrier material 4.

FIG. 4 shows a schematic sectional illustration of an exemplary embodiment of an illumination device I. The illumination device I includes a flexible printed circuit board 1, which can be realized in accordance with the embodiments in FIGS. 1 to 3.

Furthermore, the illumination device I includes at least one light-emitting diode module 9. The light-emitting diode module 9 includes at least one light-emitting diode chip, which can have an area of 1 mm$^2$, for example. The light-emitting diode module 9 is in the form of a high-intensity module and is provided for operation with electrical currents in the ampere range. In the exemplary embodiment, provision is made in particular for each light-emitting diode chip of a light-emitting diode module 9 to be designed for operation with electrical currents of up to 6 A. In particular, provision can be made for the light-emitting diode module 9 to include six such light-emitting diode chips.

Furthermore, the illumination device I includes a power electronics module 13, which has a circuit board 14, on which the power electronics components are arranged. Furthermore, at least one conductor track 15 is formed on the lower side of the circuit board 14 in the exemplary embodiment, with electrical contact being made between said conductor track 15 and the conductor tracks 5 and 6 on the flexible printed circuit board 1. For this purpose, the exemplary embodiment provides that the flexible printed circuit board 1 is plugged through a slot 16 in the circuit board 14 and positioned permanently on the lower side by means of a soldered joint 17. The soldering 17 produces the electrical contact between the conductor track 15 and the conductor tracks 5 and 6. As can be seen, the flexible printed circuit board 1 is plugged completely through the slot 16 with a second end 1b.

Such a design of an illumination device I makes it possible to drive high-intensity light-emitting diodes with rapid drive signals of below 3 μs in a relatively high frequency range of above 100 kHz.

The flexible printed circuit board 1 is designed for transmission of signals with rise and fall times of less than 10 μs.

In particular, provision is made for an illumination device I to be arranged in a projection device and to be positioned so as to illuminate a display unit of the projection device.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. An illumination device, comprising:
   a flexible printed circuit board;
   a power electronics module;
   and a light-emitting diode module, which is electrically connected to the power electronics module by means of the flexible printed circuit board
   wherein conductor tracks for signal transmission between the power electronics module and the light-emitting diode module are formed on the upper side and the lower side of the flexible printed circuit board.

2. The illumination device as claimed in claim 1, wherein the light-emitting diode module is designed for operation with electrical currents in the ampere range.

3. The illumination device as claimed in claim 1, wherein the light-emitting diode module has at least one light-emitting diode chip with a plurality of light-emitting diodes, and the light-emitting diode chip is designed for operation with electrical currents of greater than or equal to 1 A.

4. The illumination device as claimed in claim 3, wherein the light-emitting diode chip is designed for operation with electrical currents of greater than or equal to 6 A.

5. The illumination device as claimed in claim 1, wherein the carrier material of the flexible printed circuit board has a thickness of greater than 30 μm.

6. The illumination device as claimed in claim 5, wherein the carrier material of the flexible printed circuit board has a thickness of greater than 50 μm.

7. The illumination device as claimed in claim 1, wherein the carrier material of the flexible printed circuit board comprises polyimide.

8. The illumination device as claimed in claim 1, wherein the carrier material of the flexible printed circuit board is an insulating tape.

9. The illumination device as claimed in claim 1, wherein the conductor tracks of the flexible printed circuit board are covered with a solder resist or insulating tape.

10. The illumination device as claimed in claim 1, wherein the light-emitting diode module is releasably connected to the flexible printed circuit board.

11. The illumination device as claimed in claim 10, wherein plugs are arranged on the flexible printed circuit board, by means of which plugs a releasable plug-type connection with the light-emitting diode module is formed.

12. The illumination device as claimed in claim 11, wherein the plugs are arranged on one side of the flexible printed circuit board, and contact is made between the conductor track, which is formed on the opposite side of the flexible printed circuit board, and the associated plug by at least one throughplating through the carrier material.

13. The illumination device as claimed in claim 11, wherein the plugs are flat plugs.

14. The illumination device as claimed in claim 1, wherein the light-emitting diode module is permanently connected to the flexible printed circuit board.

15. The illumination device as claimed in claim 14, wherein the light-emitting diode module is permanently soldered to the flexible printed circuit board.

16. The illumination device as claimed in claim 1, wherein the flexible printed circuit board is plugged into a slot in the circuit board of the power electronics module.

17. The illumination device as claimed in claim 1, wherein the flexible printed circuit board is designed for transmission of signals with rise and fall times of less than or equal to 15 μs.

18. The illumination device as claimed in claim 17, wherein the flexible printed circuit board is designed for transmission of signals with rise and fall times of less than or equal to 10 μs.

19. A projection device, comprising:
   a display unit;
   and an illumination device, comprising:
   a flexible printed circuit board;
   a power electronics module;
   and a light-emitting diode module, which is electrically connected to the power electronics module by means of the flexible printed circuit board;
   wherein the illumination device is arranged so as to illuminate the display unit and wherein conductor tracks for signal transmission between the power electronics module and the light-emitting diode module are formed on the upper side and the lower side of the flexible printed circuit board.

* * * * *